United States Patent
Black et al.

(10) Patent No.: US 8,451,014 B2
(45) Date of Patent: May 28, 2013

(54) DIE STACKING, TESTING AND PACKAGING FOR YIELD

(75) Inventors: Bryan Black, Spicewood, TX (US); Joseph Siegel, Brookline, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 6 days.

(21) Appl. No.: 12/874,650

(22) Filed: Sep. 2, 2010

(65) Prior Publication Data

US 2011/0057677 A1 Mar. 10, 2011

Related U.S. Application Data

(60) Provisional application No. 61/240,878, filed on Sep. 9, 2009.

(51) Int. Cl.
*G01R 31/20* (2006.01)
(52) U.S. Cl.
USPC ............ 324/754.04; 324/754.05; 324/762.02; 324/762.01
(58) Field of Classification Search
USPC ........................ 324/757.05, 762.06, 754.05
See application file for complete search history.

(56) References Cited

U.S. PATENT DOCUMENTS

| | | | | |
|---|---|---|---|---|
| 5,543,727 A | * | 8/1996 | Bushard et al. | 324/750.08 |
| 6,144,215 A | * | 11/2000 | Maxwell et al. | 324/750.09 |
| 6,847,109 B2 | * | 1/2005 | Shim | 257/697 |
| 6,972,372 B1 | * | 12/2005 | Tsai et al. | 174/551 |
| 7,129,583 B2 | * | 10/2006 | Tao et al. | 257/777 |
| 7,215,032 B2 | * | 5/2007 | Trezza | 257/774 |
| 7,378,298 B2 | * | 5/2008 | Lo | 438/108 |
| 7,576,420 B2 | * | 8/2009 | Yuasa et al. | 257/685 |
| 7,973,310 B2 | * | 7/2011 | Wang et al. | 257/48 |
| 2007/0046314 A1 | * | 3/2007 | Chao et al. | 324/765 |

* cited by examiner

*Primary Examiner* — Richard Isla Rodas
(74) *Attorney, Agent, or Firm* — Sterne, Kessler, Goldstein & Fox P.L.L.C.

(57) ABSTRACT

A method to test and package dies so as to increase overall yield is provided. The method includes performing a wafer test on a first die and mounting the first die on a package substrate to form a partial package, if the wafer test of the first die is successful. The method further includes performing a system test on the partial package including the first die and stacking a second die on the first die if the system test on the partial package and the first die is successful.

23 Claims, 11 Drawing Sheets

DIE STACKING, TESTING AND PACKAGING FOR YIELD

CROSS-REFERENCE TO RELATED APPLICATIONS

This application claims the benefit of U.S. Provisional Application No. 61/240,878, entitled Die Stacking, Testing and Packaging For Yield, filed Sep. 9, 2009, which is incorporated herein by reference in its entirety.

BACKGROUND OF THE INVENTION

1. Field of the Invention

This invention generally relates to die stacking, testing, and packaging.

2. Background Art

In conventional die testing and assembly flows, dies are mounted on a package. A system test is then performed on the package to determine whether the dies in the package are functional. However, if the system test fails, both the package and the dies are discarded, reducing overall yield. Methods and systems are needed to overcome the above deficiencies.

BRIEF SUMMARY OF THE INVENTION

A method to test and package dies to increase yield is described herein. The method includes performing a wafer test on a first die. The method further includes mounting the first die on a package substrate to form a partial package if the wafer test of the first die is successful. The method also includes performing a system test on the partial package including the first die and stacking a second die on the first die if the system test on the partial package and the first die is successful.

In an embodiment, a further system test is performed on a partial package including both the first and second dies. In an alternate embodiment, the further system test is performed on a complete package including both the first and second dies.

In yet another embodiment, the second die is stacked on the first die using one or both of die-to-die vias or through-silicon-vias. Alternatively, the second die could be stacked on the first die using micro-bumps.

In an embodiment, the first die is a central processing unit (CPU) or a graphics processing unit (GPU) and the second die is a memory die.

In an example implementation, a wafer test of the first die is successful if the first die meets or exceeds predetermined thresholds of desired performance requirements. In another example implementation, the system test of the partial package and the first die is successful if the partial package and the first die meet or exceed predetermined thresholds of desired performance requirements.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

Figure 3A:
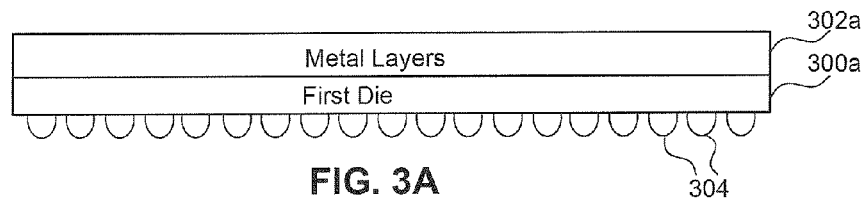
Figure 3B:
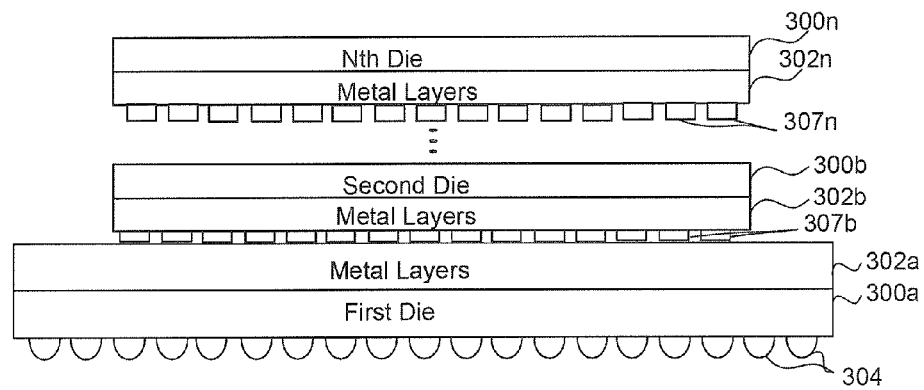
Figure 3C:
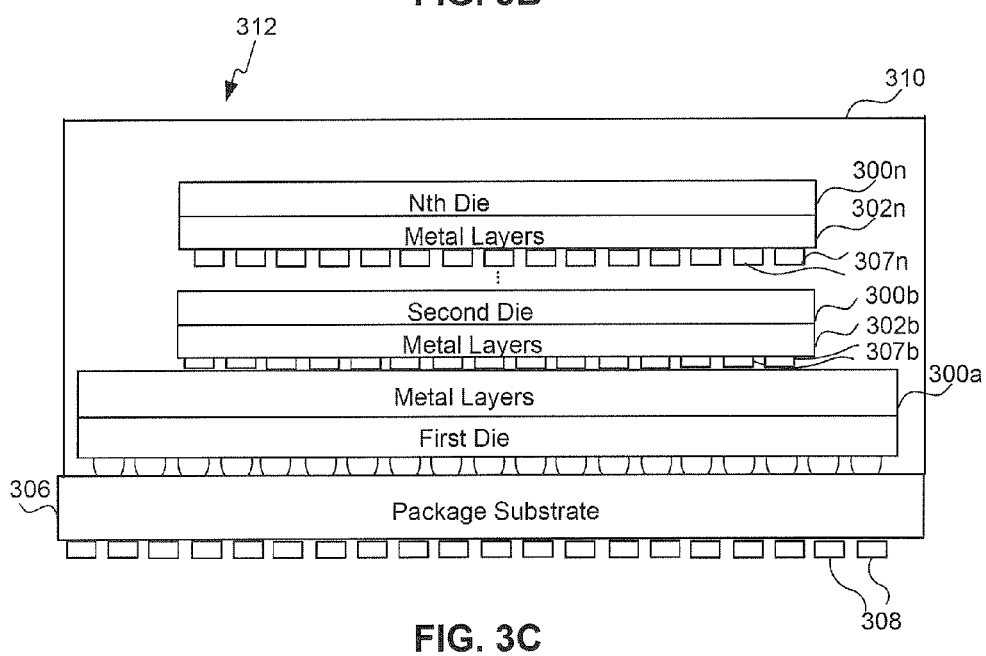

FIGS. 3A-C illustrate an example stacking, testing and packaging assembly flow.

Figure 4:
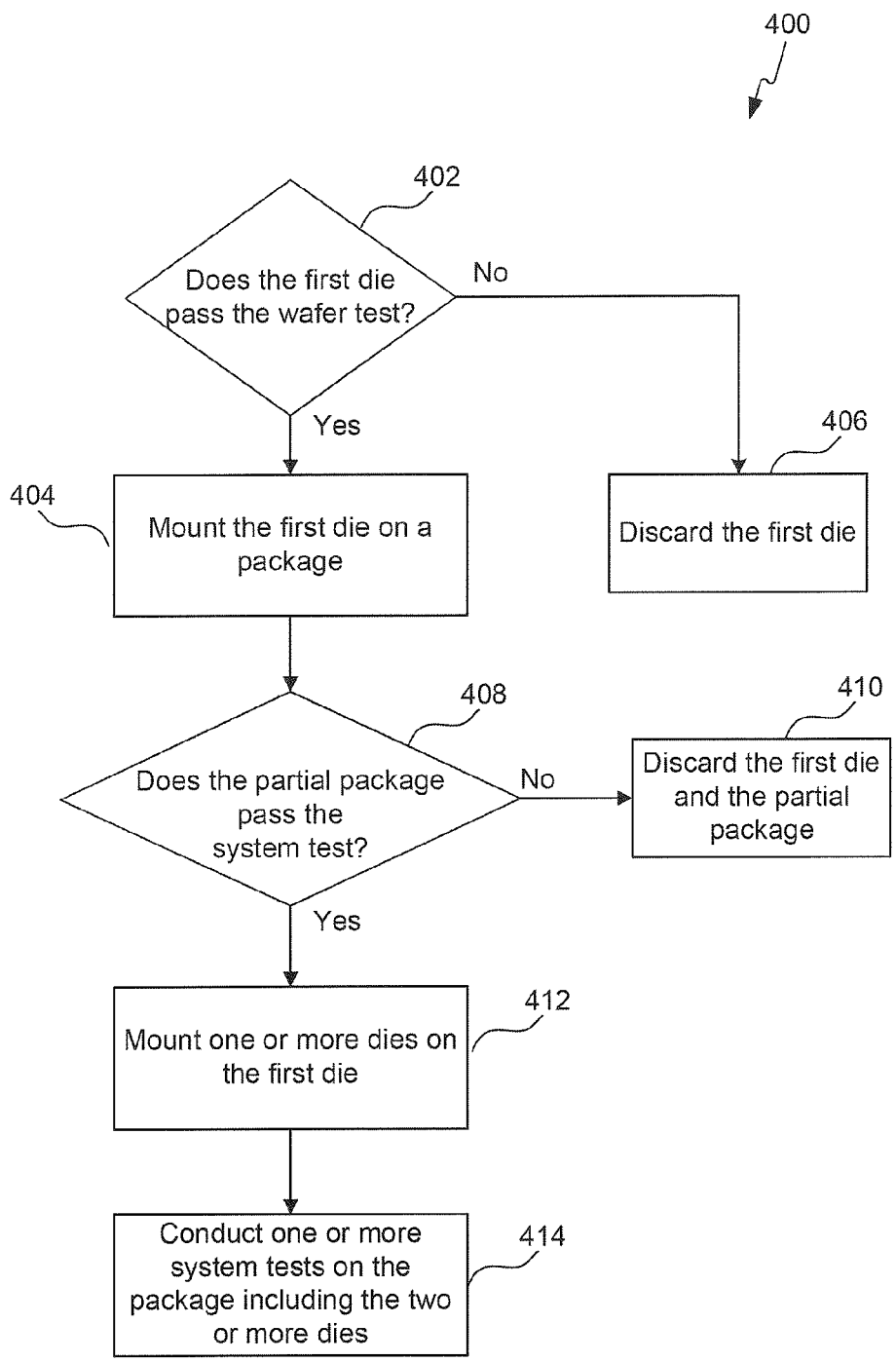

FIG. 4 illustrates an example flowchart of a method to stack, test and package dies according to an embodiment of the invention.

Figure 5A:
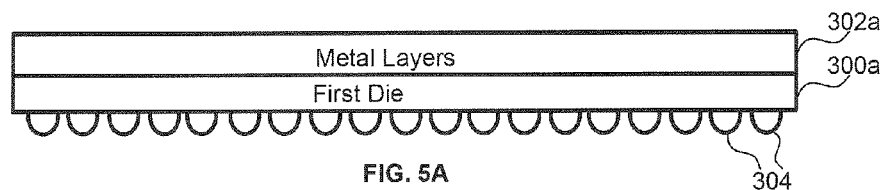
Figure 5B:
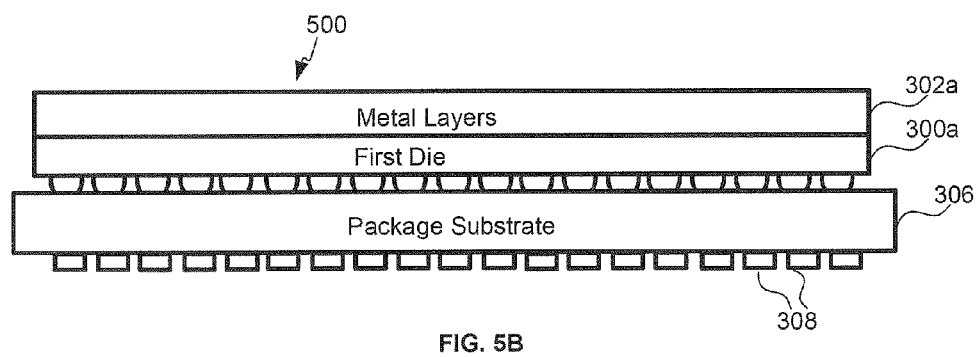
Figure 5C:
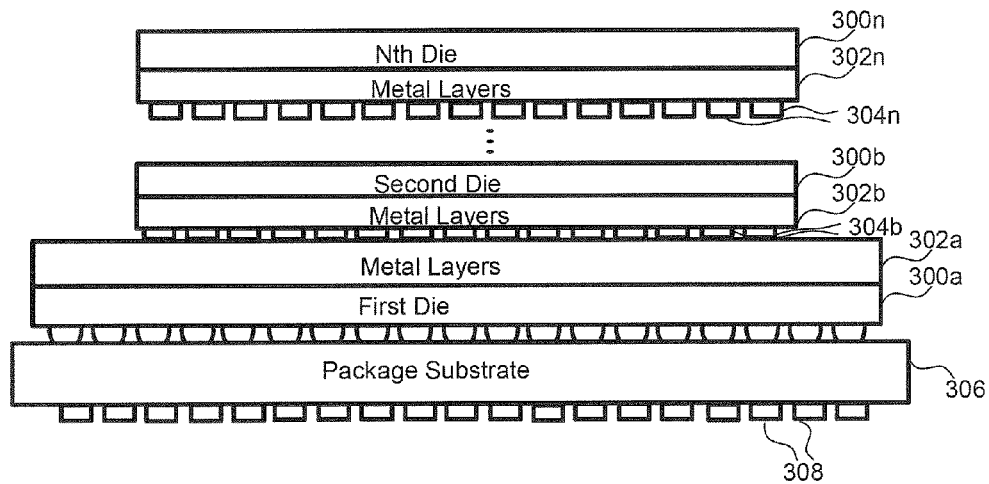

FIGS. 5A-C illustrate an example stacking, testing and packaging assembly flow according to an embodiment of the invention.

Figure 6:
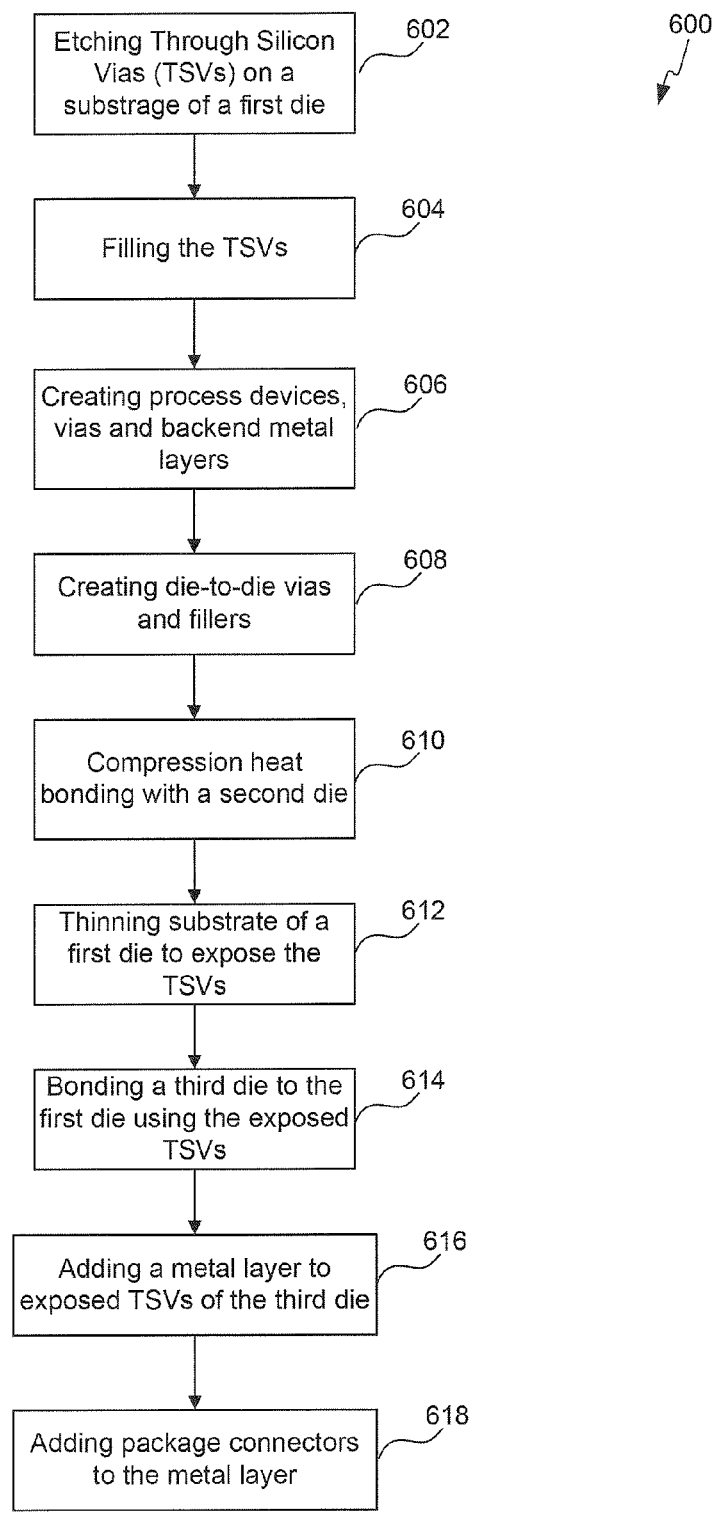

FIG. 6 illustrates an example flowchart of a method to stack multiple dies according to an embodiment of the invention.

FIG. 7 illustrates and example stacking assembly flow according to an embodiment of the invention.

Figure 8:
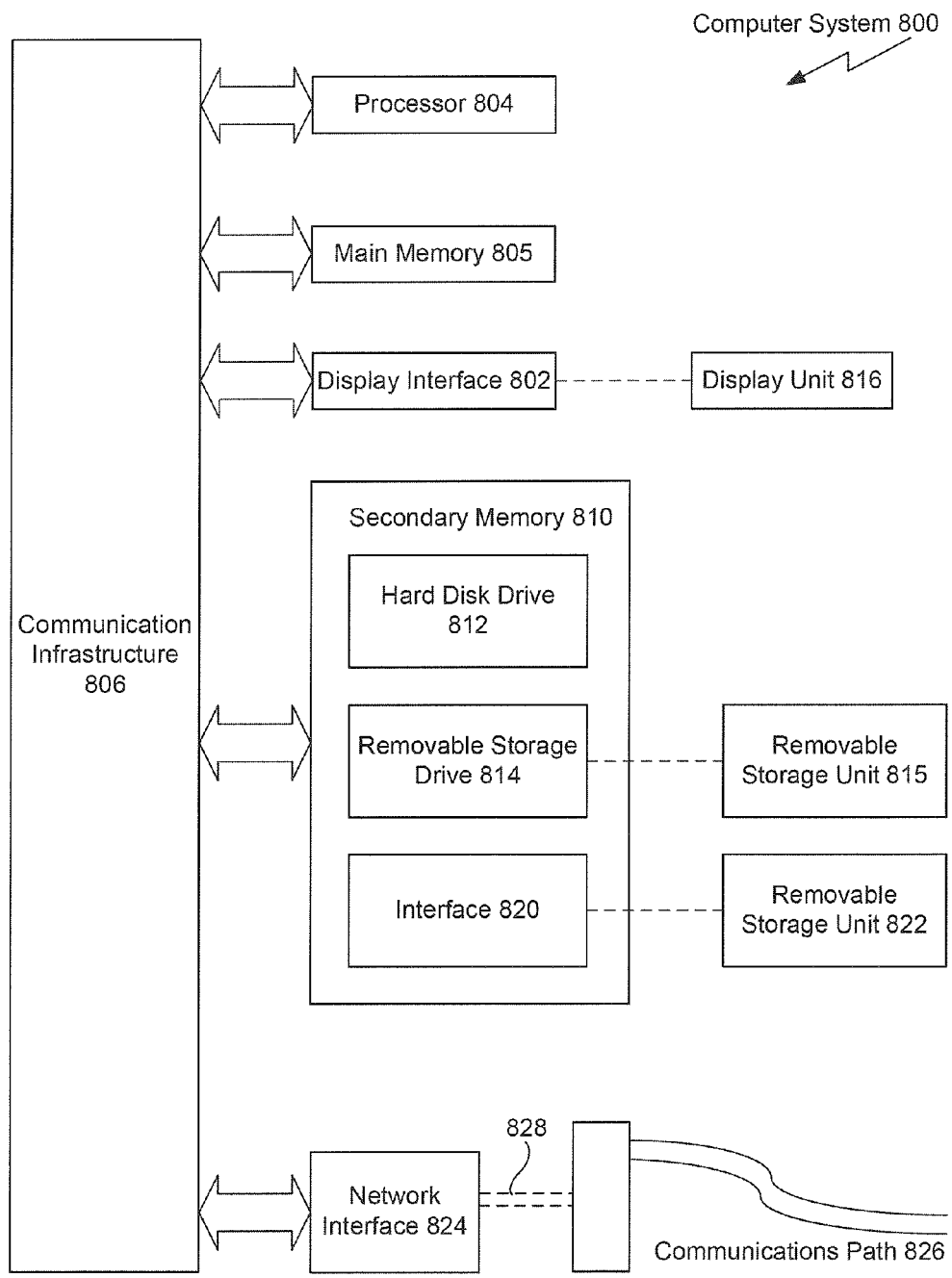

FIG. 8 is a block diagram of an exemplary computer system on which methods of the present invention can be implemented.

The present invention will now be described with reference to the accompanying drawings. In the drawings, like reference numbers may indicate identical or functionally similar elements.

DETAILED DESCRIPTION OF EMBODIMENTS OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

The present invention will be described in terms of embodiments applicable to increasing yield of a die stacking and packaging assembly flow. It will be understood that the essential concepts disclosed herein are applicable to a wide range of semiconductor assembly processes.

As used herein, the terms "die" and "chip" and the plural form of these terms are used interchangeably throughout this document and are used to denote memory or an integrated circuit on a silicon substrate as is apparent to a person skilled in the relevant art(s).

The example embodiments presented herein are described in relation to die stacking, testing and packaging. The invention however, is not limited to these example embodiments. Based on the description herein, a person skilled in the relevant art(s) will understand that the invention can be applied to other applications and a wide variety of stacking, testing and packaging flows.

Figure 1A:
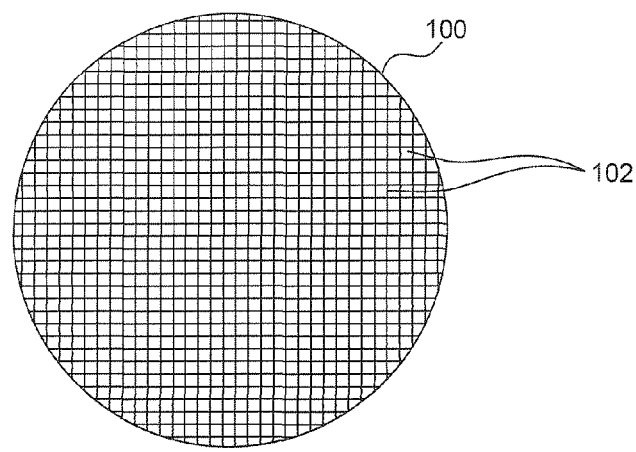
FIG. 1A illustrates an example wafer.

FIG. 1A illustrates an example wafer 100. Wafer 100 includes multiple dies 102.

During a wafer sorting process to determine "known good dies", a "wafer test", also known as a "wafer probe", is conducted on each die 102 of wafer 100. A "known good die" as described herein is a die that meets or exceeds predetermined thresholds of desired performance requirements. Desired performance requirements may include but are not limited to thermal, voltage and frequency performance requirements. During a "wafer test" or a "wafer probe" a surface of each die 102 is tested using a test probe to determine whether a die 102 can meet or exceed the predetermined thresholds for desired performance requirements. For example, a die 102 may be tested to determine whether it can perform its desired function under predetermined temperatures, voltages and frequencies. As described herein, a die is said to have passed a wafer test if the results of the wafer test meet or exceed the predetermined thresholds for performance characteristics measured during the wafer test. If the test results of a die 102 pass a certain threshold then the die 102 is deemed to be a known-good-die. A "wafer yield" is the number of known-good-dies 102 on a given wafer 100. Known-good-dies are either stacked with other known-good-dies or individually packaged in a package 106 as shown in FIG. 1B.

A wafer probe or wafer test is typically unable to perform rigorous performance tests that can only be performed on a packaged or partially packaged die. This is because a packaged or partially packaged die is necessary to create an environment close to a typical working environment for the die. The packaged or partially packaged die allows for more rigorous thermal and electrical tests compared to wafer tests. These rigorous tests are referred to as "system tests" and are described below with reference to FIG. 1B.

Figure 1B:
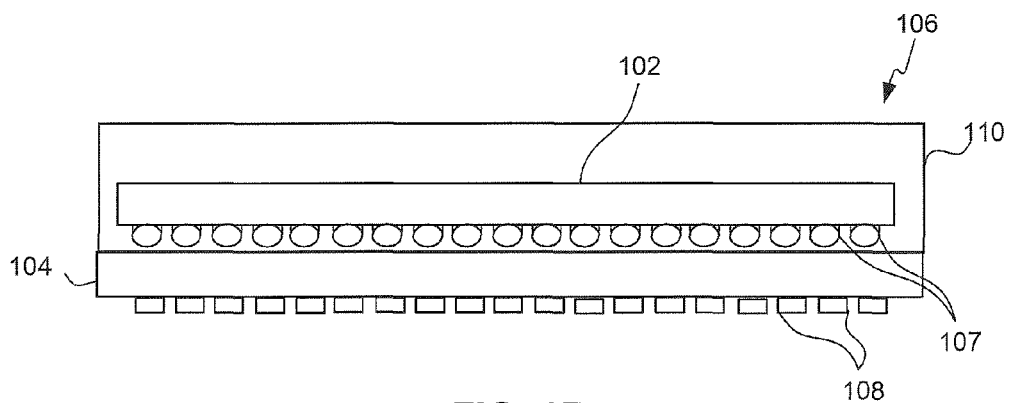
FIG. 1B illustrates an example package.

FIG. 1B illustrates an example package 106. Package 106 includes package substrate 104, package cover 110 and connectors leads 108.

In an example, die 102 may be mounted on package substrate 104 using for example connector bumps 107. Connector bumps 107 may be any type of connectors, for example, flip-chip connectors. If a die 102 is mounted on package substrate 104 without package cover 110, it is referred to as a "partial package" herein. Die 102 may be covered with package cover 110 to form what is referred to herein as a "package" or "complete package." Package cover 110 may include a thermal interface for heat dissipation. After die 102 has been packaged in package 106, a "package test" or a "system test" may be performed on package 106. For example, performance, power, thermal and electrical characteristics may be tested via leads connector 108. According to an embodiment of the invention, a system test may be performed on a partial package.

As described above, a system test differs from a wafer test in that a system test simulates an actual operating environment for a die 102. For example, if die 102 is a microprocessor die then the system test may simulate the thermal conditions of a computational device such as a desktop computer, laptop or a cell phone. For a microprocessor die, the system test may also run an Operating System on the die 102 to determine whether the die is functional. The system test may further include a battery of electrical tests to determine whether die 102 can pass voltage and frequency specification requirements of an actual operating environment. These electrical tests may be administered via connector leads 108. If package 106 passes the performance and power characteristics tests by yielding results that meet predetermined thresholds, then package 106 is deemed ready to ship to a customer. As described herein, a package or partial package is said to have passed a system test if the results of the system test meet or exceed the predetermined thresholds for performance characteristics measured during the system test.

In an example, multiple dies 102 may be stacked together prior to packaging in package 106. The terms "stacked", "mounted" and "attached" are used interchangeably throughout and refer to the assembly process where two or more dies may be bonded together. Stacking, for example stacking a microprocessor die with a memory die, allows for low latency signal exchange between the microprocessor and the memory die. In contrast, if a microprocessor die and a memory die are in separate packages and mounted on a circuit board, a latency of signal exchange times between the microprocessor and the memory will be significantly greater due to the distance between the microprocessor and the memory on the circuit board and the nature of the trace coupling the microprocessor and the memory dies. Although the stacking process provides increased device performance, the stacking process may reduce the yield. Problems with stacking and packaging dies are described below with reference to FIGS. 2-3.

Figure 2:
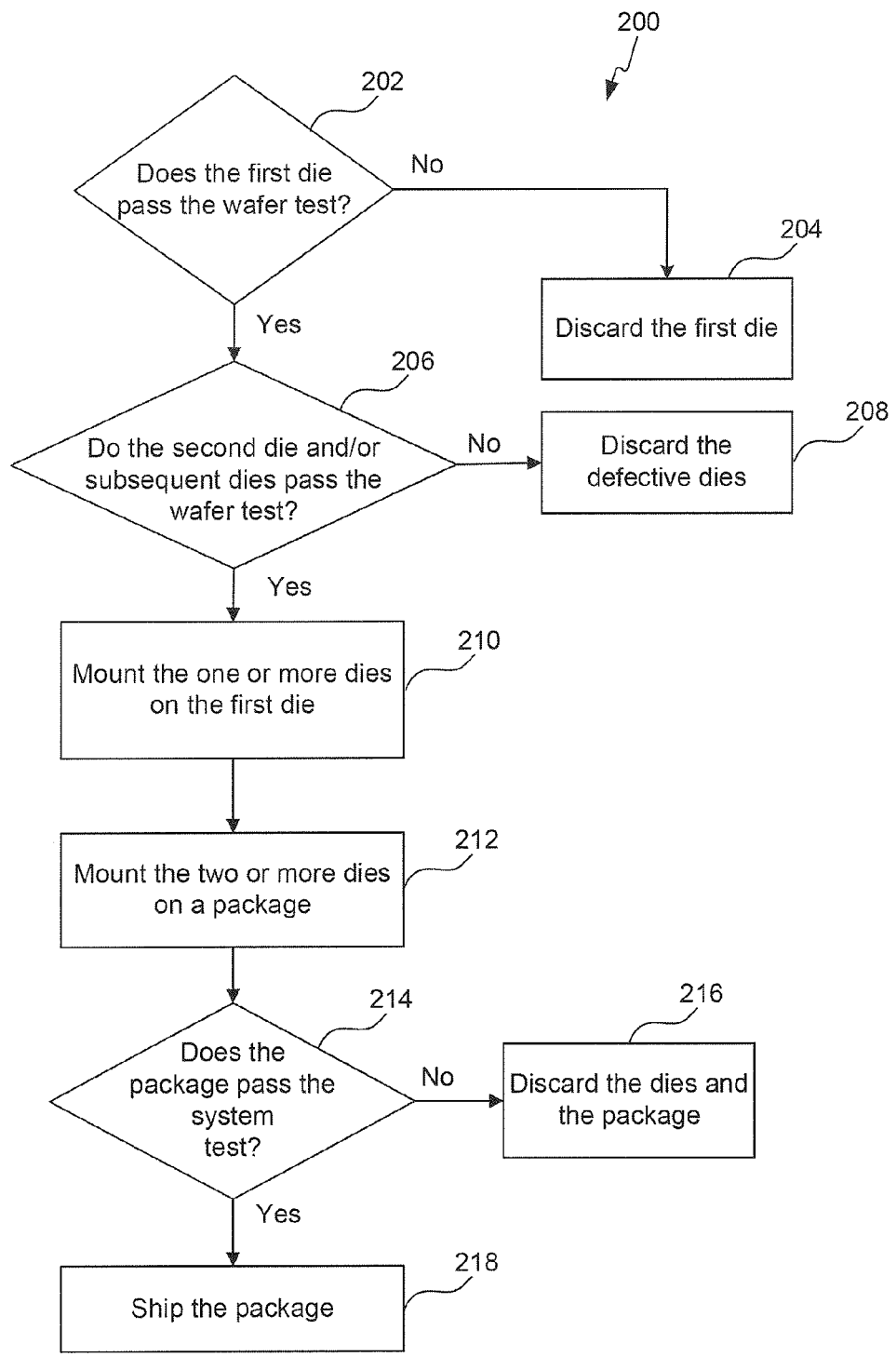
FIG. 2 illustrates an example flowchart of a method to stack, test and package dies.

FIG. 2 illustrates an example flowchart 200 of a method to stack, test and package dies. Flowchart 200 will be described with continued reference to the example illustrations in FIGS. 3A-C. However, flowchart 200 is not limited to these embodiments.

In operation 202, it is determined whether a first die passes a wafer test. For example, it is determined whether die 300a shown in FIG. 3A passes a wafer test and can be classified as a known-good-die. Die 300a may include metal layer 302a and connector bumps 304 that may be used to mount die 300a onto a package substrate 306 as shown in FIG. 3C. If it is determined in operation 202 that the first die 300a does not pass the wafer test then the first die 300a is discarded in operation 204. If it is determined in operation 202 that first die 300a passes the wafer test then the process proceeds to operation 206.

In operation 206, it is determined whether the second and subsequent dies pass the wafer test. For example, it is determined whether dies 300b-n, shown in FIG. 3B, pass the wafer test and also known-good-dies. If it is determined that the second and subsequent dies 300b-n do not pass the wafer test then the dies that failed the wafer test are discarded in operation 208. If it is determined that the second and subsequent dies 300b-n pass the wafer test then control proceeds to operation 210. In an example embodiment, second and subsequent dies 300b-n may optionally include corresponding metal layers 302b-n and corresponding micro-bumps 307b-n.

In operation 210, the second and/or subsequent dies 300b-n that passed the wafer test in operation 206, are stacked on the first die 300a. For example, as shown in FIG. 3B, second and subsequent dies 300b-n are stacked on first die 300a. An exemplary method to stack dies using through-silicon-vias (TSVs) and die-to-die vias is described in further detail below with respect to FIGS. 6 and 7. In an alternate example, dies 300a-n are stacked using corresponding micro-bumps 307b-n. It is to be appreciated that a method to stack dies is a design choice and may be arbitrary.

In operation 212, the two or more stacked dies from operation 210 are mounted on a package substrate and covered with a package cover. For example, stacked dies 300a-n are mounted on package substrate 306 as shown in FIG. 3C using connector bumps 304 and covered with package cover 310 to form package 312. Connectors 308 provide electrical connectivity to the dies enclosed in package 312.

In operation 214, it is determined whether the package passes a system test. For example, it is determined whether package 312, shown in FIG. 3C, passes a system test. If it is determined, that package 312 including dies 300a-n, does not pass the system test then the package 312 including dies 300a-n are discarded in operation 216. If it is determined that the package 312 passes the system test then the package 312 is deemed to be ready to ship to the customer in operation 218.

As described above, with reference to FIGS. 2-3, because a system test is performed on dies 300a-n after they have been packaged in package 312, all of dies 300a-n have to be discarded if any of dies 300a-n fail the system test. This results in significantly lower yields and a waste of multiple known-good-dies. Embodiments of the invention, as described below with reference to FIGS. 4-5, prevent the waste of known-good-dies by performing system tests before stacking dies together.

FIG. 4 illustrates an example flowchart 400 of a method to stack, test and package dies according to an embodiment of the invention. Flowchart 400 will be described with continued reference to the example operating environment depicted in FIGS. 5A-C. However, the flowchart 400 is not limited to that embodiment.

In operation 402, it is determined whether a first die passes a wafer test. For example, it is determined whether a first die 300a, shown in FIG. 5A, passes a wafer test. If it is determined that the first die 300a does not pass the wafer test in operation 402, then the first die 300a is discarded in operation 406. If it is determined that the first die 300a passes the wafer test in operation 402, then the process proceeds to operation 404.

In operation 404, the first die is mounted on a package substrate without a package cover. For example, as shown in FIG. 5B, first die 300a is mounted on a package substrate 306 using connector bumps 304 but no package cover 310 (as shown in FIG. 3C) is added resulting in a partial package 500.

In operation 408, it is determined whether the partial package 500, shown in FIG. 5B, passes the system test. If it is determined that the partial package 500 does not pass the system test, then the first die 300a and package substrate 306 are discarded in operation 410. If it is determined in operation 408 that the partial package 500 passes the system test, then the process proceeds to operation 412.

In operation 412, second and subsequent dies that are known-good-dies are mounted on the first die. For example, as shown in FIG. 5C, dies 300b-n are mounted on first die 300a. Metal layers 302a-n may be optional. An exemplary method to stack dies using through-silicon-vias (TSVs) and die-to-die vias is described in further detail below with respect to FIGS. 6 and 7. In an alternate example, dies 300a-n are stacked using corresponding micro-bumps 307b-n. It is to be appreciated that a method to stack dies is a design choice and may be arbitrary.

In operation 414 one or more system tests is conducted. In one example the system test may be conducted on a partial package every time a die is stacked on top of another die. For example, a second system test may be performed on partial package 500 after die 300b is mounted on die 300a, a third system test may be performed after die 300c (not shown) is mounted on die 300b and so on. In another example, a single final system test may be conducted only after all dies have been stacked and a package cover is attached to the package substrate to form a complete package. For example a single final system test may be performed on a complete package after all dies 300b-n have been stacked on die 300a and a package cover (such as package cover 310) has been attached to substrate 306.

According to embodiments presented herein, by performing system tests on partial package 500, it can be determined whether partial package 500 is functional, prior to stacking second and subsequent dies 300b-n on the first die 300a. If partial package 500 fails the system test, only the first die 300a and the package substrate 306 are discarded and known-good-dies 300b-n can be saved thereby increasing overall yield.

In an embodiment if system tests are done on partial package 500 after each die 300b-n is stacked onto first die 300a, then the testing process may be time consuming and expensive but it will also result in saving subsequent dies in the event that a system test fails on a set of stacked dies fails. If the time and costs of system tests after stacking each die 300b-n is a concern, a single final system test may be performed on the complete package. In contrast, as described above with reference to FIGS. 3-4, stacking dies 300a-n prior to performing a system test results in all known-good-dies 300a-n being discarded and therefore reducing the overall yield. Thus comparatively the present embodiments offer clear advantages of increasing overall yield.

In an example, the first die 300a is a computational die such as a microprocessor die, central processing unit die or graphics processing die and the second and subsequent dies 300b-n are memory dies. In an example, a system test on a partial package 500 including the first die 300a followed by a single final system test on package 502 is sufficient since microprocessor dies are more likely to fail than memory dies. Therefore, if the system test of the partial package including the microprocessor die is successful, then the final system test including the stacked memory dies is most like to be successful as well. In this example, time and cost for performing multiple system tests every time a die 300b-n is stacked will be saved. In another embodiment, circuitry on a first die 300a may be used to test second and subsequent dies 300b-n.

FIG. 6 illustrates an example flowchart 600 of a method to stack multiple dies according to an embodiment of the invention. Flowchart 600 will be described with continued reference to the example operating environment depicted in FIG. 7A-J. However, the flowchart is not limited to these embodiments. Note that some operations shown in flowchart 600 do not necessarily have to occur in the order shown.

Figure 7A:
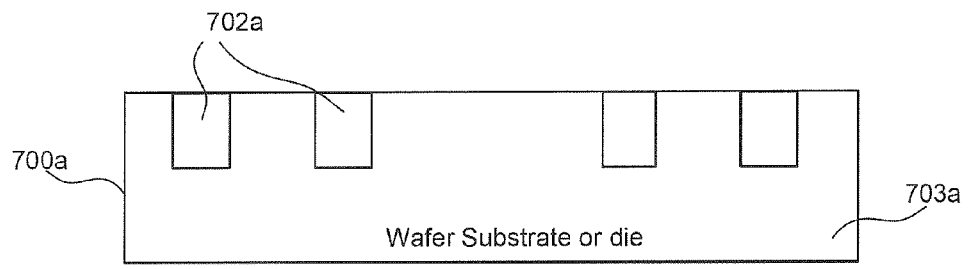

In operation 602, through-silicon-vias (TSV) are etched on a substrate of a first wafer substrate. For example, as shown in FIG. 7A, through-silicon-vias 702a are etched in a wafer substrate 703a of a first wafer substrate 700a. In an embodiment, 700a may be a die.

Figure 7B:
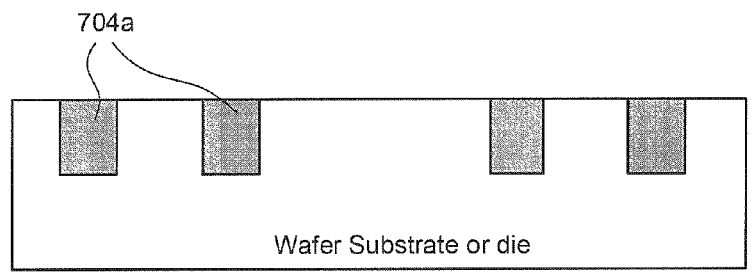

In operation 604, the through silicon vias etched in operation 602 are filled with a predetermined metal. For example, as shown in FIG. 7B, through silicon vias 702a are filled with copper or tungsten 704a.

Figure 7C:
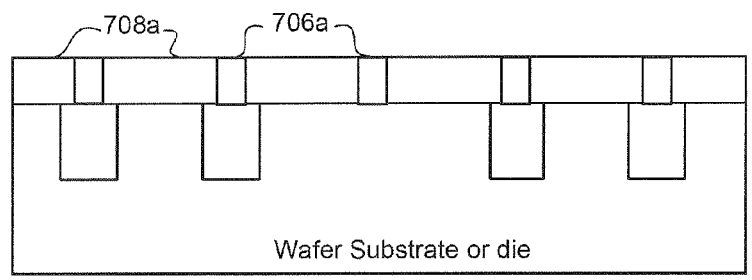

In operation 606, vias and process devices are created on the wafer substrate. For example, as shown in FIG. 7C, vias 706a and process devices 708a are created on wafer substrate 703a.

Figure 7D:
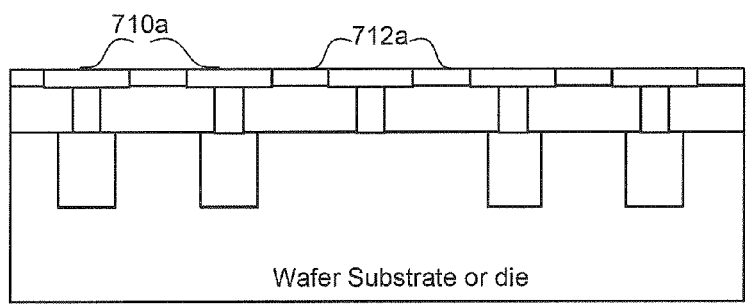
Figure 7E:
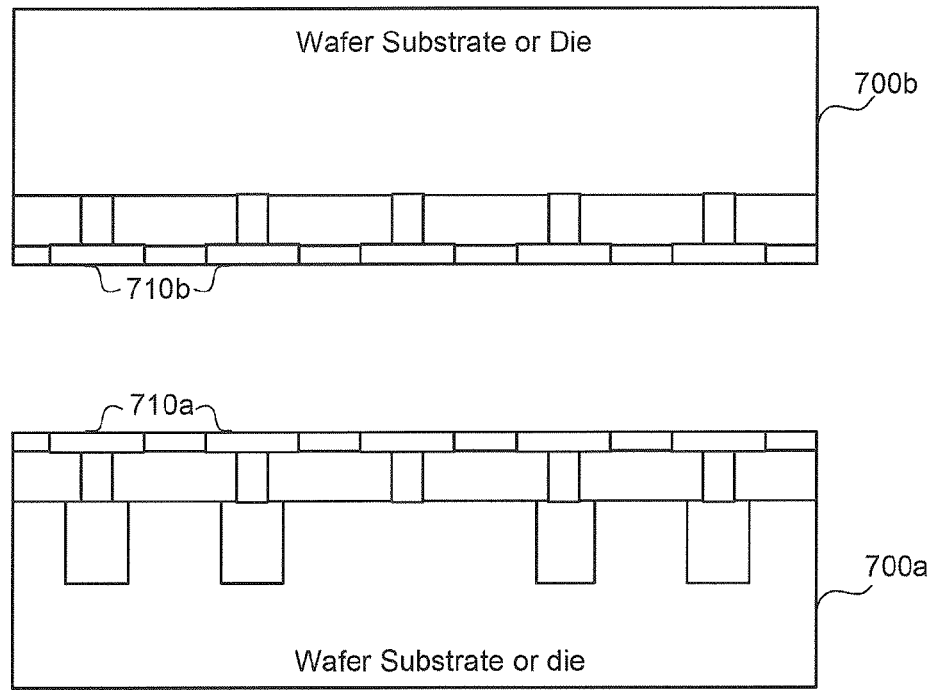

In operation 608, die-to-die vias and optional fillers are created. A second wafer or die having die-to-die vias is also created. For example, as shown in FIG. 7D, die-to-die vias 710a and fillers 712a are created. Fillers 712a may be optional. Fillers 712a may be, for example, silicon-di-oxide or any other suitable type of filler. A second wafer or die 700b having die-to-die vias 710b may also be created using similar operations as described above with reference to die 700a.

Figure 7F:
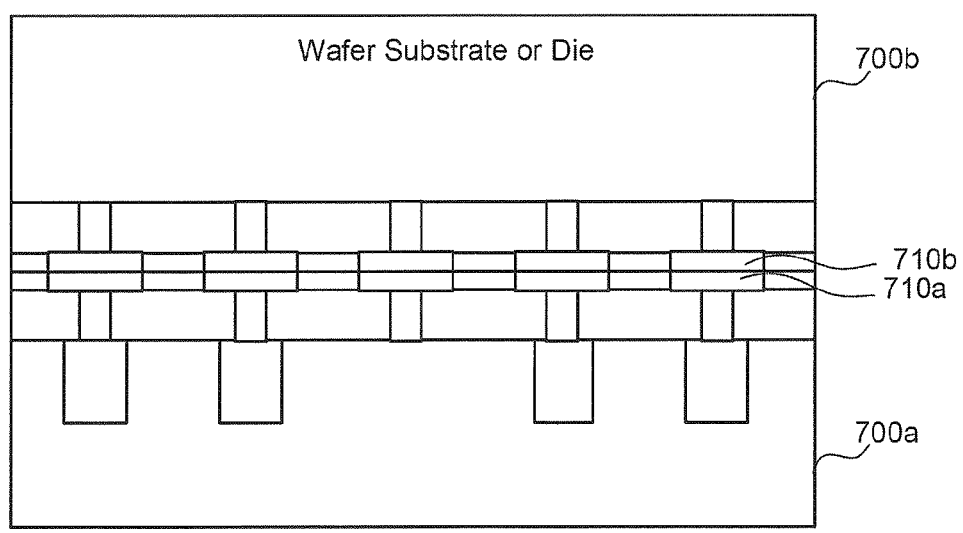

In operation 610, the first die and second dies are stacked. For example, as shown in FIG. 7F, second die 700b having die-to-die vias 710b is stacked with first die 700a that has die-to-die vias 710a. Die 700a and die 700b may be stacked using compression heat bonding.

Figure 7G:
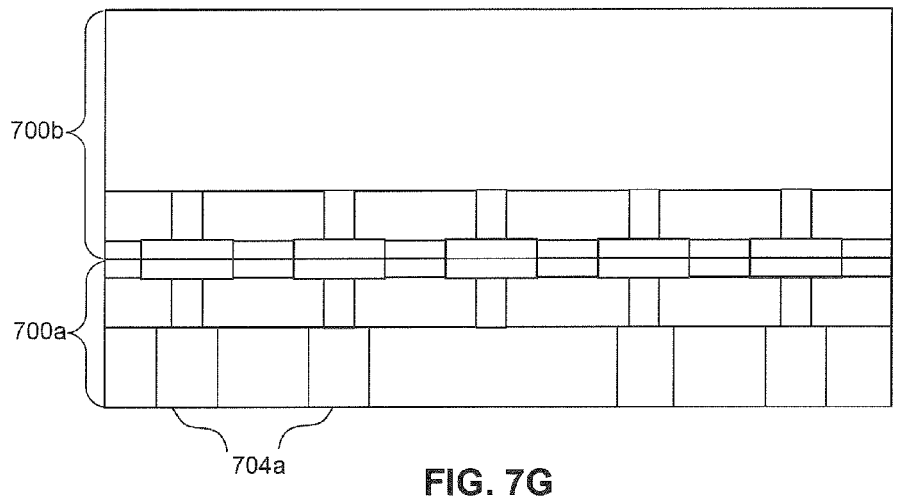

In operation 612, a substrate of the first die is thinned to expose the metal in the through-silicon-vias created in operations 604 and 606. For example, as shown in FIG. 7G, a substrate of wafer 700a is thinned to expose the metal 704a in through-silicon-vias 702a.

Figure 7H:
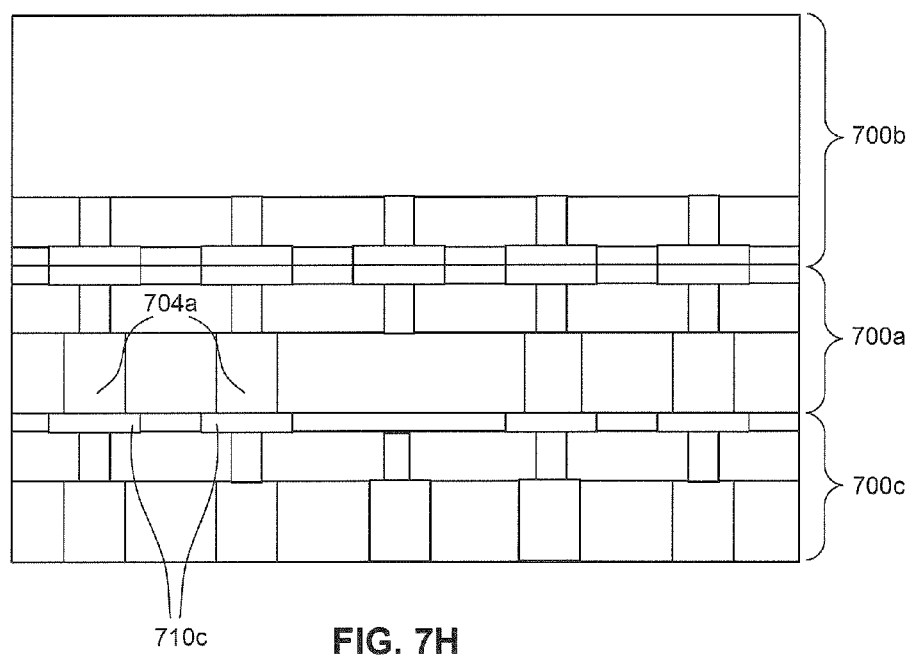

In operation 614 a third die is bonded to the first die using through-silicon-vias and die-to-die vias. For example, as shown in FIG. 7H, a third die 700c is bonded to first die 700a using die-to-die vias 710c and through-silicon-vias 704a. As described above, dies can be stacked either using die-to-die vias, through-silicon-vias, micro-bumps and any combination thereof.

Figure 7I:
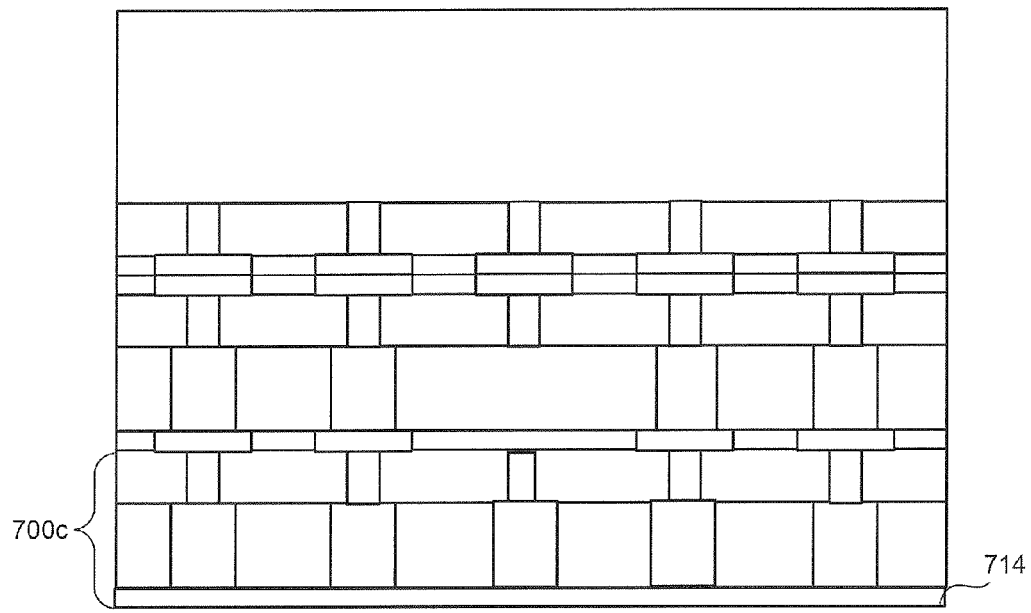
Figure 7J:
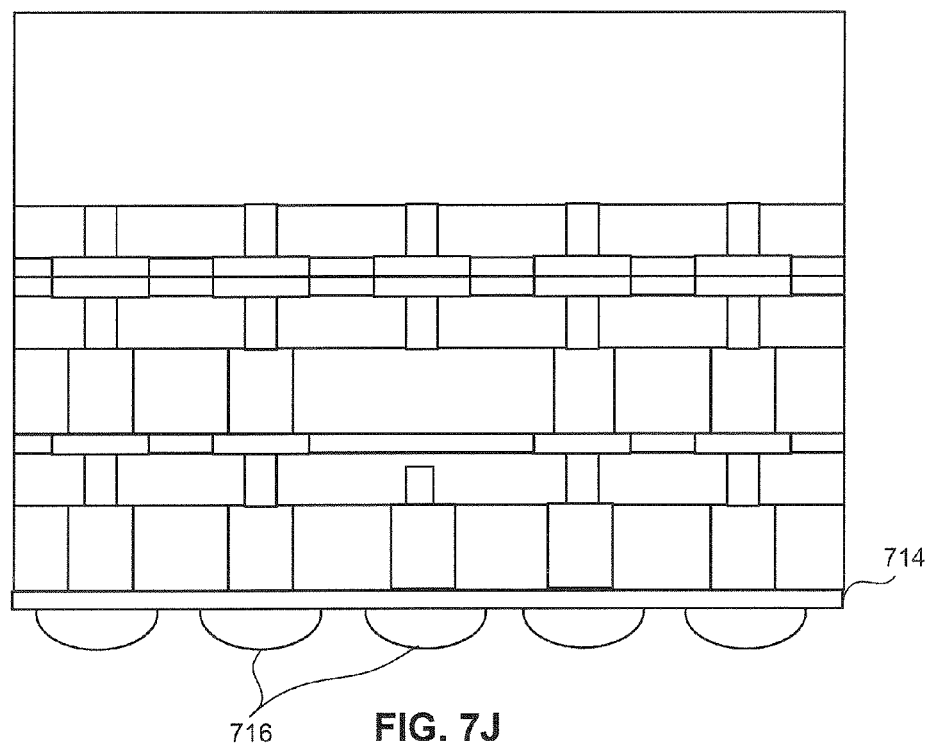

In operation 616, a metal layer is added to the exposed through-silicon-vias of the third die. For example, as shown in FIG. 7I, metal layer 714 is added to the exposed through-silicon-vias of the third die 700c.

In operation 618, connector bumps are added to the metal layer attached to the third die in operation 616. For example, flip-chip connector bumps 716 are added to the metal layer 714 of third die 700c.

The present invention may be implemented using hardware, software or a combination thereof and may be implemented in one or more computer systems or other processing systems. However, the manipulations performed by the present invention were often referred to in terms, such as adding or comparing, which are commonly associated with mental operations performed by a human operator. No such capability of a human operator is necessary, or desirable in most cases, in any of the operations described herein which form part of the present invention. Rather, the operations are machine operations. Useful machines for performing the operation of the present invention include general purpose digital computers or similar devices.

In fact, in one embodiment, the invention is directed toward one or more computer systems capable of carrying out the functionality described herein. An example of a computer system 800 is shown in FIG. 8.

Computer system 800 includes one or more processors, such as processor 804. Processor 804 is connected to a communication infrastructure 806 (e.g., a communications bus, cross over bar, or network). Various software embodiments are described in terms of this exemplary computer system. After reading this description, it will become apparent to a person skilled in the relevant art(s) how to implement the invention using other computer systems and/or architectures.

Computer system 800 can include a display interface 802 that forwards graphics, text, and other data from communication infrastructure 806 (or from a frame buffer not shown) for display on display unit 816.

Computer system 800 also includes a main memory 805, preferably random access memory (RAM), and may also include a secondary memory 810. Secondary memory 810 may include, for example, a hard disk drive 812 and/or a removable storage drive 814, representing a floppy disk drive, a magnetic tape drive, an optical disk drive, etc. Removable storage drive 814 reads from and/or writes to a removable storage unit 815 in a well known manner. Removable storage unit 815 represents a floppy disk, magnetic tape, optical disk, etc. which is read by and written to by removable storage drive 814. As will be appreciated, removable storage unit 815 includes a computer usable storage medium having stored therein computer software and/or data.

In alternative embodiments, secondary memory 810 may include other similar devices for allowing computer programs or other instructions to be loaded into computer system 800. Such devices may include, for example, a removable storage unit 815 and an interface 820. Examples of such may include a program cartridge and cartridge interface (such as that found in video game devices), a removable memory chip (such as an erasable programmable read only memory (EPROM), or programmable read only memory (PROM)) and associated socket, and other removable storage units 815 and interfaces 820, which allow software and data to be transferred from removable storage unit 815 to computer system 800.

Computer system 800 may also include a communications interface 824. Communications interface 824 allows software and data to be transferred between computer system 800 and external devices. Examples of communications interface 824 may include a modem, a network interface (such as an Ethernet card), a communications port, a Personal Computer Memory Card International Association (PCMCIA) slot and card, etc. Software and data transferred via communications interface 824 are in the form of signals 828 which may be electronic, electromagnetic, optical or other signals capable of being received by communications interface 824. These signals 828 are provided to communications interface 824 via a communications path (e.g., channel) 826. This channel 826 carries signals 828 and may be implemented using wire or cable, fiber optics, a telephone line, a cellular link, an radio frequency (RF) link and other communications channels.

In this document, the terms "computer program medium" and "computer usable medium" are used to generally refer to media such as removable storage drive 814, a hard disk installed in hard disk drive 812, and signals 828. These computer program products provide software to computer system 800. The invention is directed to such computer program products.

Computer programs (also referred to as computer control logic) are stored in main memory 805 and/or secondary memory 810. Computer programs may also be received via communications interface 824. Such computer programs, when executed, enable computer system 800 to perform the features of the present invention, as discussed herein. In particular, the computer programs, when executed, enable processor 804 to perform the features of the present invention. Accordingly, such computer programs represent controllers of computer system 800.

In an embodiment where the invention is implemented using software, the software may be stored in a computer program product and loaded into computer system 800 using removable storage drive 814, hard drive 812 or communications interface 824. The control logic (software), when executed by processor 804, causes processor 804 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. Applicants therefore rescind any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A method, comprising:
   mounting a first die on a package substrate, to form a partial package if a wafer test of the first die is successful, wherein the partial package requires one or more additional dies to be mounted in order to form a complete package;
   performing a system test on the partial package, wherein performing the system test comprises performing a performance and power characteristic test on the partial package;
   determining if the partial package is functional as a system, wherein the partial package is functional when the system test yields a set of results that meet predetermined thresholds; and
   based on determining the partial package is functional as a system, mounting a second die on the first die, otherwise discarding the partial package.

2. The method of claim 1, further comprising performing a system test on a partial package including both the first and second dies.

3. The method of claim 1, further comprising performing a system test on a complete package including both the first and second dies.

4. The method of claim 1, further comprising: stacking a third die on the second die using one or both of die-to-die vias and through-silicon-vias.

5. The method of claim 1, further comprising: creating at least one of die-to-die vias or through-silicon-vias (TSVs) on the first and/or second die prior to the stacking step.

6. The method of claim 5 farther comprising: filling the through-silicon-vias with copper or tungsten prior to the stacking step.

7. The method of claim 6, the stacking step further comprising: stacking the second die on the first die using one or both of the die-to-die vias or the through-silicon-vias.

8. The method of claim 1, the stacking step further comprising: stacking the second die on the first die using microbumps on the second die.

9. The method of claim 1, wherein the first die is a central processing unit or a graphics processing unit.

10. The method of claim 1, wherein the second die is a memory die.

11. The method of claim 1, further comprising: creating process devices and vias on the first and second dies prior to the stacking step.

12. The method of claim 1, farther comprising: thinning a substrate of the first and/or second die to expose through-silicon-vias prior to the stacking step.

13. The method of claim 1, wherein the wafer test of the first die is successful if the first die meets or exceeds predetermined thresholds of desired performance requirements.

14. The method of claim 1, wherein the system test of the partial package and the first die is successful if the partial package and the first die meet or exceed predetermined thresholds of desired performance requirements.

15. The method of claim 1, wherein the system test on the partial package is conducted using lead connectors of the partial package and wherein the lead connectors are external to the partial package.

16. The method of claim 1, wherein the system test determines at least one of performance, power, thermal and electrical characteristics of the first die via lead connectors of the package in a simulation of an operating environment of the first die.

17. The method of claim 1, wherein the system test includes electrical tests to determine whether the first die can pass voltage and frequency specification requirements of an operating environment of the first die.

18. The method of claim 1, wherein the system test runs an Operating System (OS) on the first die to determine whether the first die is functional.

19. The method of claim 1, wherein the system test simulates thermal conditions of a computational device, and wherein the computational device is one of a desktop computer, a laptop computer or a cell phone.

20. A method, comprising:
   creating a first die having die-to-die vias, through-silicon vias, and connector bumps;
   mounting the first die on a package substrate using the connector bumps to form a partial package, wherein the partial package requires one or more additional dies to be mounted in order to form a complete package;
   performing a system test on the partial package, wherein performing the system test comprises performing a performance and power characteristic test on the partial package;
   determining if the partial package is functional as a system, wherein the partial package is functional when the system test yields a set of results that meet predetermined thresholds; and
   based on determining the partial package is functional as a system, stacking a second die on the first die using at least one of the die-to-die vias and the through-silicon vias.

21. The method of claim 20, further comprising performing a system test on the partial package including both the first and second dies.

22. The method of claim 20, further comprising performing a system test on a complete package including both the first and second dies, the complete package including the partial package and a package cover.

23. A method, comprising:
mounting a first die on a package substrate to form a partial package if a wafer test of the first die is successful;
performing a system test, wherein the system test comprises performing a performance and power characteristic test on the partial package, and the system test runs an Operating System (OS) on the first die to determine whether the first die is functional; and
stacking a second die on the first die if the system test on the partial package is successful, wherein the system test on the partial package is successful if it yields a set of results that meet predetermined thresholds.

* * * * *

UNITED STATES PATENT AND TRADEMARK OFFICE
CERTIFICATE OF CORRECTION

| | | |
|---|---|---|
| PATENT NO. | : 8,451,014 B2 | Page 1 of 1 |
| APPLICATION NO. | : 12/874650 | |
| DATED | : May 28, 2013 | |
| INVENTOR(S) | : Black et al. | |

It is certified that error appears in the above-identified patent and that said Letters Patent is hereby corrected as shown below:

In the Claims

Column 9

Line 43, please replace "substrate, to form" with --substrate to form--.

Column 10

Line 4, please replace "farther" with --further--.

Column 10

Line 21, please replace "farther" with --further--.

Column 10

Line 52, please replace "through-silicon" with --through-silicon- --.

Column 11

Line 2, please replace "through-silicon vias." with --through-silicon-vias.--.

Signed and Sealed this
Thirty-first Day of December, 2013

Margaret A. Focarino
*Commissioner for Patents of the United States Patent and Trademark Office*